United States Patent [19]

Simmonds

[11] Patent Number: 4,766,388
[45] Date of Patent: Aug. 23, 1988

[54] METHOD AND APPARATUS FOR HIGH VOLTAGE TESTING OF COILS WITH GROUNDED INSULATION

[75] Inventor: Leonard B. Simmonds, Winter Springs, Fla.

[73] Assignee: Westinghouse Electric Corp., Pittsburgh, Pa.

[21] Appl. No.: 3,535

[22] Filed: Jan. 15, 1987

[51] Int. Cl.[4] ...................... G01R 31/06; G01R 31/12
[52] U.S. Cl. .................................. 324/545; 324/546; 324/551
[58] Field of Search ............... 324/514, 515, 527, 536, 324/537, 545–547, 551, 554, 557, 158 MG; 200/148.6; 361/14; 174/17 GF

[56] References Cited

U.S. PATENT DOCUMENTS 2,900,597  8/1959  Gooding ............................. 324/514

FOREIGN PATENT DOCUMENTS 2132928  12/1972  Fed. Rep. of Germany ...... 324/514

Primary Examiner—Reinhard J. Eisenzopf
Assistant Examiner—Jack B. Harvey

[57] ABSTRACT

High voltage testing of stator coils having grounded insulation, end turns with ungrounded insulation, and uninsulated terminals is conducted by placing a non-conductive, preferably transparent and flexible tube over each end turn and injecting a gas, such as silicon hexaflouride $SF_6$, having a higher breakdown voltage than air into the tube at one end, so that it flows down the tube around the end turn and out the other end. If desired, the tube can be sealed at the inlet end or both ends by flexible sleeves which are secured snugly about the end turns. Also optionally, the tube can be supported by an adjustable stand so that it does not touch the end turn.

12 Claims, 2 Drawing Sheets

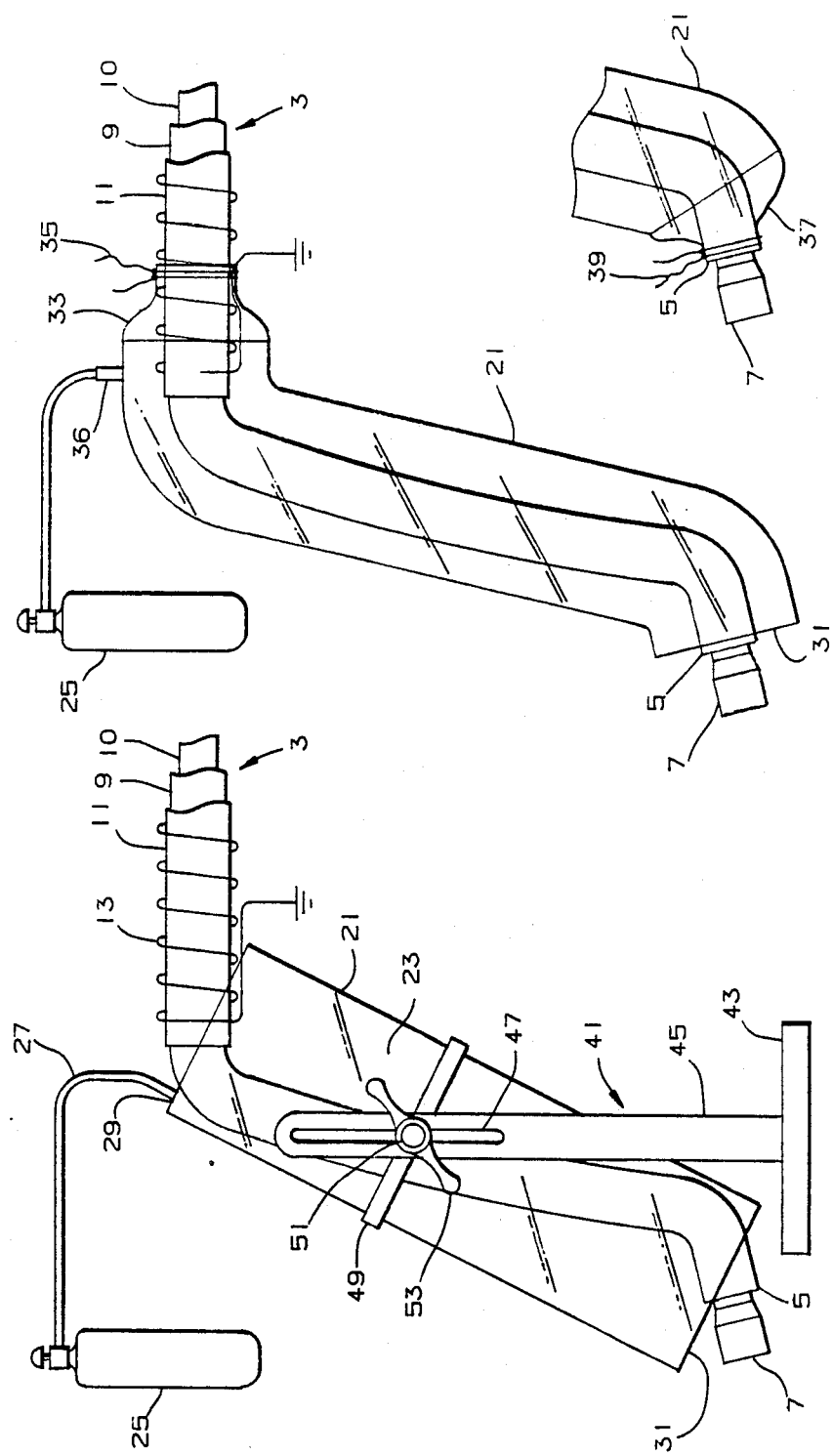

METHOD AND APPARATUS FOR HIGH VOLTAGE TESTING OF COILS WITH GROUNDED INSULATION

BACKGROUND OF INVENTION

1. Field of Invention

This invention relates to a method and apparatus for high voltage testing of large electrical coils and in particular to testing turbine generator stator coils with grounded insulation and having end turns with ungrounded insulation at which flash over is likely to occur before the insulation fails.

2. Background Information

Large turbine generators typically have a number of coils inserted in slots in a stator frame. The insulation on the coils is painted with conductive paint to ground the surface of the insulation to the stator frame. Insulated end turns on the coils terminate in uninsulated terminals. Samples of such coils are tested by increasing the voltage applied to the terminals at a controlled rate until the insulation on the coils fails. The usual mode of failure is a puncture in the insulation. Very often, however, flashover occurs before the insulation fails. By flashover it is meant that an arc is struck along the surface of the ungrounded insulation on an end turn between the terminal and the grounded insulation on the coil. The primary cause of flashover is breakdown, or ionization, of the ambient air adjacent the end turn. Humid air breaks down more readily than dry air so that flashover is more likely to occur in a humid atmosphere.

To avoid flashover, so that a true test of the insulation can be made, insulated test bars (laboratory specimens) are immersed in transformer oil or placed in a box filled with silicon hexaflouride, $SF_6$ gas, both of which have higher breakdown strength than ambient air. While satisfactory for testing small samples, these remedies are much more difficult to apply to full size coils which typically extend 20 feet in length. Huge containers of oil and very large volumes of $SF_6$ would be required to immerse these full size coils for testing. In addition, the large volumes of oil and gas are difficult to handle and would require large pieces of equipment. Furthermore, the oil is difficult to keep clean and impurities can alter its dielectric properties. The oil can also penetrate the insulation which affects the results of the tests.

With this background in mind, it is the primary object of the present invention to provide a method and apparatus for high voltage testing of coils with grounded insulation, ungrounded insulation on the end turns and uninsulated terminals which require a minimum of equipment and fluid, and are economical, and easy to use.

SUMMARY OF THE INVENTION

These and other objects are realized by the invention which comprises directing a flow of a gas having a breakdown voltage higher than that of ambient air, such as for example silicon hexafluoride, $SF_6$ or dry nitrogen, around the ungrounded insulation on the end turns while the test voltage applied to the coil is increased until the grounded insulation on the coil breaks down. The flow is confined to the periphery of the ungrounded insulation on the end turns by placing a tube of non-electrically conducting material over the end turn and injecting the gas into the tube to fill the space between the end turn and the tube with the gas. Since the duration of the test is not great, this gas can be injected into one end of the tube so that it flows through the tube around the end turn and out the other end. Where the gas is denser than the ambient air, such as is the case with $SF_6$, and the end turns are oriented so that one end of the tube is higher than the other, the gas is injected into the higher end so that it falls down through the tube around the end turn and out the lower end.

The tube does not have to be rigid but should form a space around substantially the full length of the end turn which can be occupied by the gas. A flexible tube can adjust to the curvative of the end turns. While it is not essential that the tube not touch the end turn since it is electrically non-conductive, it is desirable to support the tube with a stand so that it is not resting on the end turn.

It is also not essential that the tube be transparent, however, a transparent tube allows one to observe the development of corona activity around the end turn lead.

While a great deal of gas is not required for the relatively short duration of the test, the amount of gas used and dispersement of the gas into the atmosphere may be minimized by enclosing at least one end of the tube. When only one end of the tube is enclosed, the gas is injected at the closed end and flows down the tube and out the other end so that there is less mixing with the ambient air. When both ends of the tube are closed, the end opposite that at which the gas is injected can be kept open initially to purge air from the tube. The test ends can be closed by a fabric sleeve which can be sealed by an elastic band, draw string or other non-conducting fastener.

BRIEF DESCRIPTION OF THE DRAWINGS

A full understanding of the invention can be gained from the following description of the preferred embodiments when read in conjunction with the accompanying drawings in which:

FIG. 2 is a side elevation view of one embodiment of the invention in place on an end turn of a steam turbine-generator stator coil;

FIG. 3 is a side elevation view of another embodiment of the invention; and

FIG. 4 is a partial side elevation view of yet another embodiment of the invention.

DESCRIPTION OF THE PREFERRED EMBODIMENTS

Figure 1:
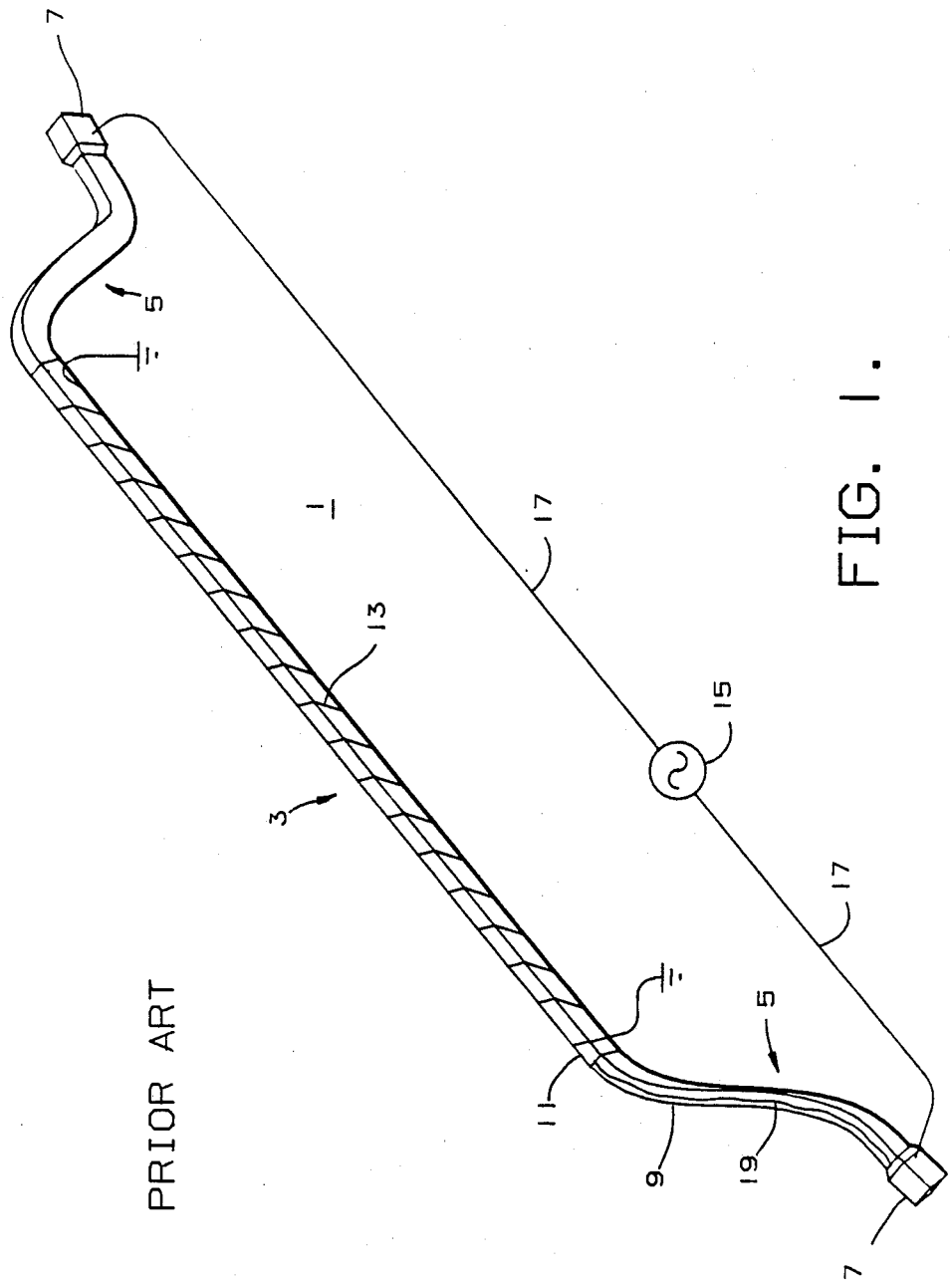
FIG. 1 is an isometric view of a steam turbine-generator stator coil which has been removed from the stator and set up for testing.

FIG. 1 illustrates a stator coil 1 for a turbine-generator (not shown) on which the invention is used. Such a coil comprises a single turn, straight winding 3 of copper conductor rectangular in cross section and typically about 20 feet in length, and in the range of 2 to 5 inches in width and 1 to 3 inches in thickness depending upon the coil rating. At each end of the coil is an end turn 5 which is curved to conform to a frusto conical surface on a stator frame when the coil is installed in a slot in the frame. The end turns 5 terminate in headers 7 through which cooling water is introduced for circulation through the coil.

The coil 3 and end turns 5 are enclosed in electrical insulation 9 while the headers 7 are uninsulated. The insulation on the coil 3 is covered with a layer 11 of electrically conductive paint which grounds the outer surface of the coil insulation to the stator frame when the coil is installed in a stator. Sample coils selected for testing are wrapped with a grounding wire 13 to simulate conditions in a stator. The insulation 9 on the end turns 5 is not grounded.

The selected coils are subjected to high voltage testing to the point of failure of the insulation 9. The test is carried out by connecting an adjustable high voltage power source 15 to the uninsulated headers 7 by leads 17. The voltage of the power source 15 is increased at the rate of about 5 KV per minute until the insulation 9 fails. Failure occurs when the insulation is punctured by an arc which is struck between the conductor 10 (See FIG. 2) and the grounded paint surface 11 on the outside of the insulation on the coil 3.

Very often, however, before the insulation fails, flashover occurs at the uninsulated end turns 5. Although there is no conductive paint on these insulated end turns so that the surface of the insulation is not grounded, as the voltage applied to the coil by the source 15 increases, an arc 19 is eventually struck along the surface of the end turn between the uninsulated header 7, and the conductive paint 11 and grounding wire 13 on the coil 3. The arc results from ionization of the air along the surface of the end turn. In the exemplary coils, flashover occurs at about 90 to 95 KV, so that the voltage at which the insulation fails is not reached. This phenomonem occurs at lower voltages in humid air.

In accordance with the invention, a tube 21, which is shown as cylindrical in cross-section, but which may have any suitable cross-sectional shape, is placed over the end turns forming an open ended enclosed space 23 around the ungrounded but insulated end turns 5 as shown in FIG. 2. The tube 21 is made of any suitable electrically non-conductive material. The exemplary tube is made of plexiglass. The tube can also be made of a flexible material such as polyethylene film which is rolled into a tube and sealed longitudinally as shown in FIG. 3. Although it is not essential, it is preferred that the material be transparent for reasons discussed below.

A gas which has a higher break down voltage than air supplied by a source, such as the pressurized gas cylinder 25, is injected through a delivery hose 27 into one end 29 of the tube 21 and flows through the space 23 displacing the air and enveloping the end turn 5 before flowing out the other end 31 of the tube 21. A suitable gas is silicon hexafluoride, $SF_6$, which has a density greater than air. Such a gas should be injected into the higher end of tube 21 so that its downward flow through the tube is aided by gravity. It is not essential that all of the air be displaced by the gas, such as $SF_6$ but that it be substantially replaced so that the breakdown voltage of the gaseous mixture is increased to a value above that at which the insulation of the insulated windings fails. It is also not necessary that the entire length of the end turn 5 be bathed in the $SF_6$, but a substantial length sufficient to raise the flashover voltage above the failure voltage of the insulation on the coil must be covered.

While the flow of gas in the arrangement of FIG. 1 is continuous, the rate does not have to be very high and the time required for the voltage to be raised to a value at which the insulation fails is not long. The flow of gas required can be reduced by enclosing the end of the tube at which the gas is introduced. Thus, as shown in FIG. 3, this end of the tube may be sealed against the insulated wiring so that the entire end turn is bathed in the gas. The seal may be effected by a fabric sleeve 33 which is fixed to the end of the tube at one end and is drawn tight around the winding at the other end by any suitable fastener such as a draw string 35 or a Velcro fastener. The gas can be introduced through a feed tube 36 in the main tube or through the sleeve adjacent the winding. In this arrangement, the gas still flows through the tube around the insulated end turn 5 and out the other end 29, but less air is likely to be drawn in and mixed with the gas.

If it is desired to further limit the volume of gas used and to reduce the discharge of the gas into the atmosphere, the other end of the tube can also be sealed such as with a fabric sleeve 37 which also have a fastener 39 to secure it snugly around the end turn 5 as shown in FIG. 4. If desired this second end can be left open initially to purge air from the space 13.

If desired, the tube 21 can be supported by a stand 41 such that the tube 21 does not touch the end turn 5, and therefore the end turn is surrounded with the gas. It has been found, however, that it is not required that the tube not touch the end turn and hence the stand is a matter of choice. The stand 41 illustrated in FIG. 2, includes a base 43, an upright 45 with an adjustment slot 47, and a support ring 49 which grips the tube 21 and has a threaded shaft 51 which passes through the slot 47 in the upright and is engaged by a wing nut 53. With this arrangement the tube can be supported clear of the end turn 5 at an adjustable height and angle relative to the upright 45 by positioning the tube and tightening the wing nut 53.

Whereas in the past, flashover on a typical stator coil occurred at about 90 to 95 KV, and hence the voltage at which the insulation failed was not reached, with the invention similar coils have been taken up to about 120 KV where the insulation failed without any flashover. The transparent tube was useful in this example in that it afforded the opportunity to observe corona activity around the insulated end turns during the test.

As can be appreciated from the description, the system according to the invention is portable, easy to use, requires a small column of gas, and can be used in the shop or field where coils are tested out of the stator.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. A method of preventing flashover during high voltage testing of electrical coils having windings with grounded insulation, end turns with ungrounded insulation, and uninsulated terminals, said method comprising the steps of:

placing a tube of electrically non-conductive material around an end turn oriented such that one end of said tube is higher than the other end; and injecting a gas having an electrical breakdown voltage greater than ambient air into said tube at the one end so that said gas falls downward through said tube around said end turn with ungrounded insulation and passes out of the other end of said tube to bathe said end turn in said gas.

2. The method of claim 1 wherein said gas is silicon hexafluoride.

3. A method of preventing flashover during high voltage testing of electrical coils having windings with grounded insulation, end turns with ungrounded insulation, and uninsulated terminals, said method compromising the steps of:

placing a tube of electrically non-conductive material around an end turn;

injecting a gas having an electrical breakdown voltage greater than ambient air into said tube to bathe said end turn in said gas; and sealing said tube at one end about the end turn and injecting the gas into the sealed end of the tube such that it flows down the tube around the end turn and out the other end of the tube.

4. Apparatus for preventing flashover during high voltage testing of electrical coils having grounded insulation, end turns with ungrounded insulation, and uninsulated terminals, said apparatus comprising:

an electrically non-conductive tube which is placed over and extends substantially the full length of an insulated end turn, a source of a pressurized gas having an electrical breakdown voltage higher than that of ambient air, and means for introducing said gas into one end of said tube such that said gas flows down said tube around the end turn and out the other end of the tube to provide a layer of said gas around the end turn.

5. The apparatus of claim 4 wherein said tube is transparent thereby making visible any corona activity around said insulated end turn.

6. The apparatus of claim 4 wherein said end turn is curved and said tube is flexible and conforms to the curvature of the end turn.

7. The apparatus of claim 4 including a stand for supporting said tube such that the tube does not touch the end turn and therefore the end turn is surrounded by said gas.

8. Apparatus for preventing flashover during high voltaage testing of electrical coils having grounded insulation, end turns with ungrounded insulation, and uninsulated terminals, said apparatus comprising:

an electrically non-conductive tube which is placed over and extends substantially the full length of an insulated end turn, a source of a pressurized gas having an electrical breakdown voltage higher than that of ambient air, means for introducing said gas into said tube to provide a layer of said gas around the end turn, and said tube being open at both ends and said means for introducing said gas into said tube introduces gas into one end thereof such that the gas flows down said tube around the end turn and out the other end of the tube.

9. Apparatus for preventing flashover during high voltage testing of electrical coils having grounded insulation, end turns with ungrounded insulation, and uninsulated terminals, said apparatus comprising:

an electrically non-conductive tube which is placed over and extends substantially the full length of an insulated end turn, a source of a pressurized gas having an electrical breakdown voltage higher than that of ambient air, means for introducing said gas into said tube to provide a layer of said gas around the end turn, seal means for sealing at least one end of said tube about the end turn, and said seal means including a flexible sleeve connected at one end to said at least one end of the tube and fastener means at the other end of the sleeve for securing the same snugly to the end turn.

10. The apparatus of claim 9 including a feed tube adjacent the sealed end of the tube through which said gas is introduced into the tube.

11. Apparatus for preventing flashover during high voltage testing of electrical coils having grounded insulation, end turns with ungrounded insulation, and uninsulated terminals, said apparatus comprising:

an electrically non-conductive tube which is placed over and extends substantially the full length of an insulated end turn, a source of a pressurized gas having an electrical breakdown voltage higher than that of ambient air, means for introducing said gas into said tube to provide a layer of said gas around the end turn, seal means for sealing at least one end of said tube about the end turn, and seal means for sealing the other end of said tube about the end turn.

12. The apparatus of claim 11 wherein each of said seal means includes a flexible sleeve connected at one end to the tube and fastener means at the other end of the sleeve for securing the same snugly to the end turn.

* * * * *